United States Patent [19]
Ami et al.

[11] Patent Number: 5,904,766
[45] Date of Patent: May 18, 1999

[54] PROCESS FOR PREPARING BISMUTH COMPOUNDS

[75] Inventors: Takaaki Ami; Katsuyuki Hironaka; Koji Watanabe; Akio Machida, all of Kanagawa, Japan

[73] Assignee: Sony Corporation, Tokyo, Japan

[21] Appl. No.: 08/732,923

[22] Filed: Oct. 17, 1996

[30] Foreign Application Priority Data

Oct. 24, 1995 [JP] Japan ............................. P07-275859

[51] Int. Cl.⁶ ........................................ C30B 1/10
[52] U.S. Cl. .................... 117/3; 117/2; 117/4; 117/6; 117/944; 505/501
[58] Field of Search ................ 505/501; 117/2, 117/3, 4, 6, 944

[56] References Cited

U.S. PATENT DOCUMENTS

| | | | |
|---|---|---|---|
| 5,236,889 | 8/1993 | Sugihara et al. | 505/501 |
| 5,639,714 | 6/1997 | Hikata et al. | 505/501 |
| 5,661,114 | 8/1997 | Otto et al. | 505/501 |
| 5,703,021 | 12/1997 | ven Schnering et al. | 505/501 |
| 5,798,318 | 8/1998 | Li et al. | 505/501 |

*Primary Examiner*—Robert Kunemund
*Attorney, Agent, or Firm*—Hill & Simpson

[57] ABSTRACT

Provided is a process for preparing a bismuth compound at a heat treatment temperature lower than conventional. A bismuth compound is prepared by the steps of heating under vacuum to form a reduced phase and heating under oxidizing environment of normal or lower pressure.

11 Claims, 5 Drawing Sheets

PROCESS FOR PREPARING BISMUTH COMPOUNDS

BACKGROUND OF THE INVENTION

1. Field of the Invention

The present invention relates to a process for preparing bismuth compounds useful for use in electronic devices such as ferroelectric memories.

2. Description of the Related Art

Bismuth compounds, in particular bismuth layer compounds, are a class of compounds which are industrially very important in bismuth superconductive oxides having a critical temperature of 110K, materials for ferroelectric memories or the like. In order to apply these compounds to electronic devices, a process for forming thin films must be developed.

For these bismuth layer compounds, for example, $Bi_2(Sr,Ba,Ca)(Ta,Nb)_2O_9$, a temperature for heat treatment in a process for preparing a bulk is 1,000° C. or higher (see G. A. SMOLENSKII et al., SOVIET PHYSICS-SOLID STATE, p.651–655 (1961)) while a temperature for post annealing in a process for preparing a thin film is about 800° C. (see C. A. Paz de Araujo et al., International Patent Publication #WO93/12542 (Jun. 24, 1993)).

The above mentioned high heat treatment temperature may cause various problems with respect to semiconductor processes.

In capacitors using a bismuth layer compound, for instance, hillock (i.e., growth of coarse particles) may be caused in a platinum lower electrode which becomes one of electrodes of a capacitor, or a buffer layer which is formed between the platinum lower electrode and an electrode-forming surface thereof may deteriorate in the heat treatment due to a problem of its heat resistance.

When titanium nitride TiN is used as a buffer layer, for instance, the annealing temperature should be decreased to 700° C. at the highest, preferably to about 650° C. or lower.

Illustrative methods for decreasing the annealing temperature include development of a new starting material or film-formation as deposited, i.e., in the state of a film as simply formed by a ultra-high vacuum process such as MOMBE (metal organic molecular beam epitaxy; CBE). At present, however, these methods could not have crystallized oxides such as bismuth layer compounds.

OBJECT AND SUMMARY OF THE INVENTION

In order to solve the above mentioned problems, the present invention has an object to provide a process for preparing a bismuth compound using a lower heat treatment temperature than conventional processes.

The process of the present invention is a process for preparing a bismuth compound comprising steps of heating a precursor material of a bismuth compound at a reduced pressure to produce a reduced phase and heating to oxidize said precursor material in an oxidizing environment at a normal or lower pressure.

According to the present invention, the precursor material (reduced phase) of a desired bismuth compound can be produced at a lower temperature than conventional ones by heating at a reduced pressure while the desired bismuth compound can be obtained by oxidizing the precursor material under heating in an oxidizing environment at a normal or lower pressure.

DESCRIPTION OF THE PREFERRED EMBODIMENT

Figure 1:
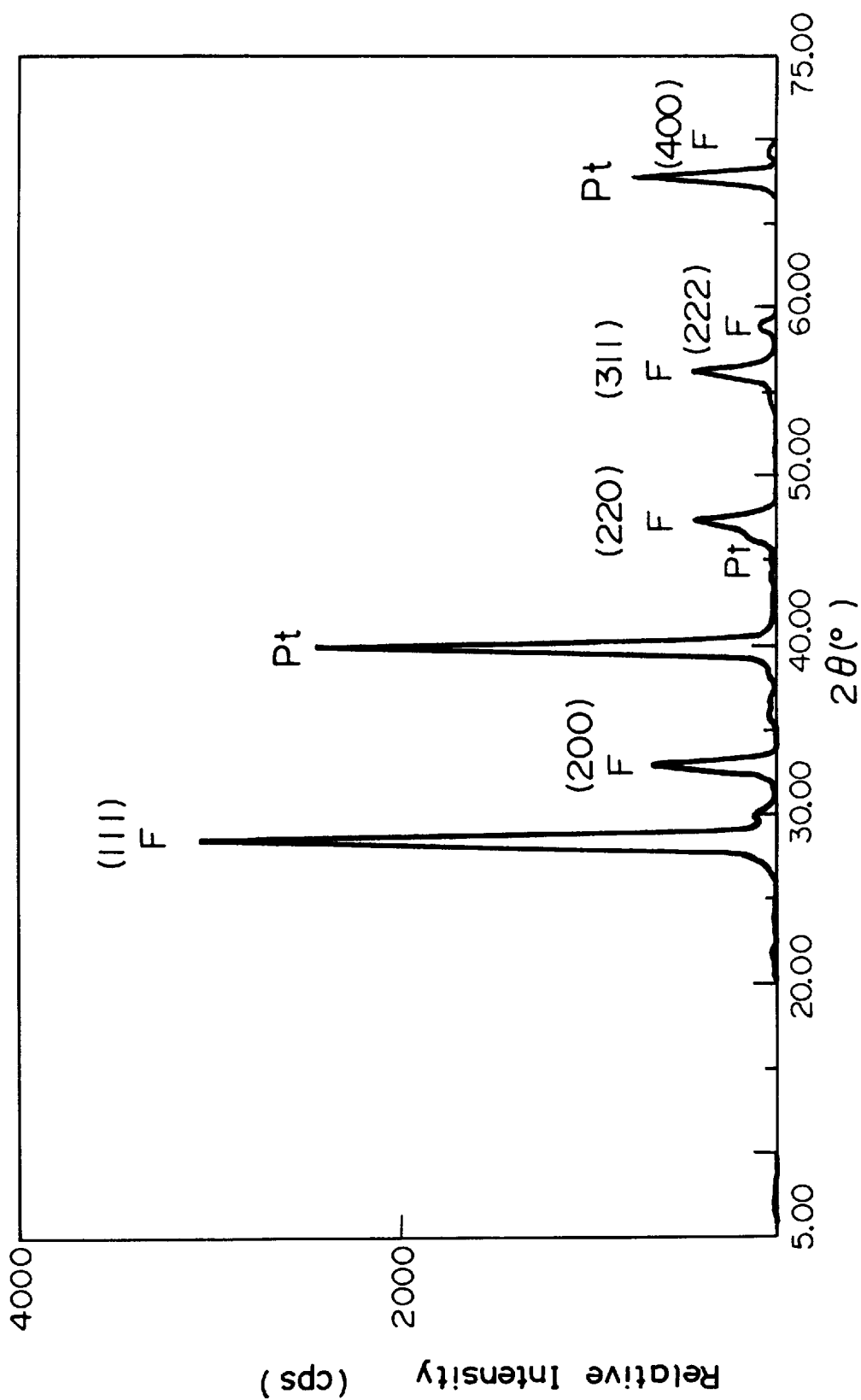
FIG. 1 is an X-ray diffraction pattern of a thin film of a fluorite structure compound as a precursor material.

The process for preparing a bismuth compound according to the present invention comprises heating at a reduced pressure to produce a reduced phase followed by heat-oxidization in an oxidizing environment at a normal or lower pressure.

Several methods are known for heating at a reduced pressure, i.e., heat-treatment at a reduced pressure: included are high purification treatments such as desiliconization in zirconia and other degassing and deoxygenation and processes for volatilizing excess components (Pb) in lead titanate ($PbTiO_3$) as well as film-forming methods such as sputtering and other plasma-utilizing processes and vacuum chemical vapor deposition (CVD).

In a bismuth superconductive material doped with lead, the temperature of the heat treatment could be decreased and the process margin could be enlarged by reducing the partial pressure of oxygen gas in a mixed gas (total pressure thereof being one atmosphere) of argon and oxygen gases used in the synthesis to 1/13 or lower; see U. Endo et al., J.J.A.P., vol. 127, L1476 (1988).

In the process for preparing a bismuth compound according to the present invention, the bismuth compound to be prepared includes, for example, bismuth layer compounds having a composition of $Bi_2(Sr,Ba,Ca)(Ta,Nb)_2O_9$ used as ferroelectric materials, and bismuth superconductive materials.

When the bismuth compound is prepared, a thin film of a precursor material is first formed by any of various conventional film-forming methods, including sol-gel method, spin coat method such as metal oxide decomposition (MOD), liquid source misted chemical decomposition (LSMCD), chemical vapor deposition (CVD) using a metal halide or hydride, metal organic chemical vapor deposition (MOCVD) using dipivaloyl methanato (DPM) as a source, flash CVD where sources are conveyed and mixed in a liquid phase and rapidly evaporated by abrupt reduction of pressure in a reaction chamber, and physical deposition such as vacuum deposition, molecular beam epitaxy, laser ablasion and sputtering.

In the preparation of the above mentioned bismuth layer compounds, for example, a precursor material having a structure of fluorite $CaF_2$ is first prepared. It is important that a thin film of the precursor material having a fluorite structure should have a composition such that bismuth is slightly in excess of a desired bismuth layer compound to be prepared. On the contrary, the thin film should be slightly devoid of alkaline earth metals such as strontium.

In each of the above mentioned film-forming methods, such a composition may be achieved by adjusting the composition of a charged material in the sol-gel and MOD methods, or the film-forming conditions in the laser ablasion and sputtering methods.

Preferably, the film-forming conditions for forming a thin film of the precursor material are such that the reaction temperature is 400° to 750° C.; the reaction gas pressure is 0.01 to 50 torr; and the reaction environment is an oxidizing gas containing 5% or more oxygen.

The thus prepared precursor material is heated in a reduced pressure (lower than about $1\times10^{-2}$ torr, preferably lower than $5\times10^{-4}$ torr) environment at about 650° C. In this step, the precursor material is reduced. When the introduced oxygen defect becomes too much to retain the structure of the precursor material, the crystal structure is altered and a reduced phase appears.

The thus obtained reduced phase is then gradually pressurized in an oxygen environment at the same temperature. With the increase of the total pressure, the precursor material is again produced but the phase fraction of a desired bismuth compound, e.g., a compound having the bismuth layer structure, is simultaneously increased. However, the phase fraction will not exceed 50 to 60% in the oxygen environment.

Then, a heat treatment is further conducted in an oxygen environment containing a few percents of ozone at a normal pressure and about 400° C.; a thin film comprising as a main phase a desired bismuth compound, e.g., a compound having a bismuth layer structure is generated.

Thus, the desired bismuth compound may be prepared under these conditions.

The process for preparing a bismuth compound according to the present invention will be generally illustrated hereinbelow by way of example for a bismuth layer compound having a compositional formula: $Bi_2SrTa_2O_9$ as a bismuth compound.

For example, if the film-forming method is a solution evaporating CVD, a precursor material having a fluorite structure may be synthesized as deposited, i.e., in the as film-formed state without annealing. The solution evaporating CVD method will be further described hereinbelow.

A substrate used comprises for example Ti and Pt which have been subsequently deposited on a silicon by sputtering.

A CVD source may be suitably selected from $BiPh_3$ (triphenyl bismuth) and $Bi(O-Tol)_3$ etc. as a Bi source, $Sr(DPM)_2$ (dipivaloyl strontium) and $Sr(Me_5C_5)_2\cdot 2THF$ etc. as a Sr source, and $Ta(OCH_3)_5$ and $Ta(O-iPr)_5$ etc. as a Ta source.

When a Bi source used is an oxygen-containing material such as $Bi(O-iPr)_3$, $Bi(O-tC_4H_9)_3$, $Bi(O-tC_5H_{11})_3$ or $Bi(O-Tol)_3$, the compound of a fluorite structure may be produced even in the absence of an oxidizing environment.

These source materials are dissolved in an organic or other solvent, conveyed in the liquid state and introduced into a reaction vessel together with Ar carrier gas. Preferably, the source solution is evaporated by abruptly reducing the pressure to about 0.1 to 10 torr in a vaporizer, followed by deposition on a substrate in the gas phase. When pure oxygen is used as an oxidizing gas, the flow rate thereof is adjusted so that the oxygen partial pressure is about 50% based on the total pressure.

If the oxygen partial pressure is less than 20%, the main phase will be an amorphous film devoid of bismuth. An oxygen partial pressure higher than 70% is not preferred since the product will be too devoid of an alkaline earth metal strontium.

The mixing ratio of each source may preferably be determined by analyzing the composition of a trial thin film with an electron probe microanalyzer (EPMA) or fluorescent X-ray spectrometer and comparing the results with a desired composition and adjusted on the basis of the comparison.

If the source materials are supplied in a suitable comporisional ratio, a single or near-single phase thin film of fluorite structure can be obtained at a substrate temperature of about 400° to 750° C.

The thus obtained precursor material is heated in oxygen of about $5\times10^{-4}$ torr or lower at about 650° C. for at least 15 minutes to yield the above mentioned reduced phase.

Then, the material is heated in oxygen environment of about 5 to 10 torr at about 650° C. In this step, a thin film wherein the phase fraction of a bismuth layer compound is about 50% can be obtained.

The material is further heated in oxygen gas containing a few percents of ozone at a lower temperature of about 400° C., for at least 30 minutes; thus, a thin film having a bismuth layer compound $Bi_2SrTa_2O_9$ as a main phase can be obtained.

Hereinbelow, an example of the preparation of a bismuth layer compound according to the process for preparing a bismuth compound of the present invention will be illustrated. In this example, a thin film comprising a bismuth layer compound having a composition $Bi_2SrTa_2O_9$ is prepared.

Onto the (100) surface of a spontaneously oxidized silicon, Ti and Pt are subsequently deposited each in a thickness of 100 nm by sputtering at room temperature to form a substrate.

CVD source materials chosen are e.g. $BiPh_3$, $Sr(DPM)_2$ and $Ta(O-iPr)_5$. These source materials are dissolved each in an organic solvent such as THF (tetrahydrofuran) to prepare solutions with a concentration of about 0.1 M/l.

These solutions are mixed at an initial liquid volume ratio of Bi:Sr:Ta=2:1:2 and conveyed and introduced into a vaporizer. The vaporizer is appropriately heated so that the source materials should not be precipitated and deposited on the inner wall of the vaporizer.

The evaporated solution is introduced from the vaporizer into a reactor together with Ar carrier gas.

The vaporizer and reactor is evacuated to about 10 torr to evaporate the source solution. The evaporated source solution in the gas phase is conveyed and deposited onto the substrate.

The temperature of the substrate is about 600° C.

On the other hand, an oxidizing gas such as pure oxygen, a balanced oxygen gas (a mixed gas of 80% argon and 20% oxygen, or the like), ozone, $N_2O$ or $NO_2$ is introduced into the reactor directly without passing through a vaporizer.

Each of the Ar carrier and oxidizing gases is adjusted to a flow rate of 500 sccm by a mass flow controller.

Thus, a near-single phase thin film of a fluorite structure with excellent crystallinity can be obtained. The X-ray diffraction pattern of this thin film is shown in FIG. 1.

In FIG. 1, the peaks designated as F are derived from a bismuth compound having a fluorite structure and those designated as Pt are from Pt of the substrate beneath the thin film. The bracketed numerals attached to the symbol F represent the corresponding crystal face.

Figure 2:
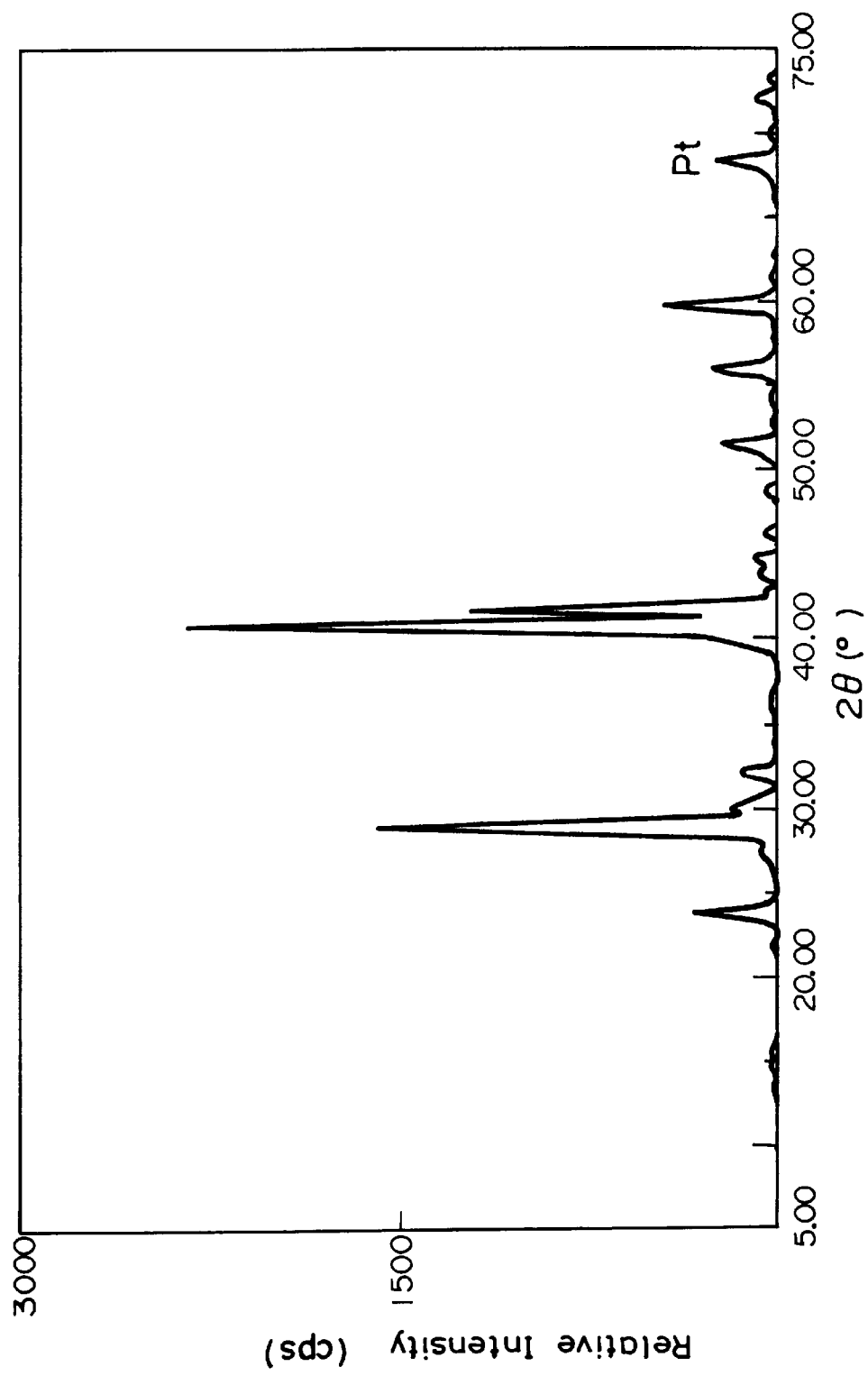
FIG. 2 is an X-ray diffraction pattern of a reduced phase thin film obtained by heating the thin film of the precursor material compound of a fluorite structure in oxygen at $4 \times 10^4$ torr, 650° C. for 2 hours.

The above mentioned reduced phase can be obtained by heating the thus obtained precursor material in oxygen at $4\times10^{-4}$ torr, about 650° C. for 2 hours. The X-ray diffraction pattern of this thin film is shown in FIG. 2. As seen from comparison between FIGS. 1 and 2, the clearly different diffraction pattern indicates change of the crystal system due to introduction of oxygen defect. That is, a reduced phase is produced.

Then, heat treatment is conducted at an oxygen pressure of 5 or 10 torr at 650° C. for about 30 minutes. The X-ray diffraction patterns of these thin films after heat treatment are shown in FIGS. 3 and 4, respectively, wherein Pt and Bi represent peaks derived from platinum and bismuth layer compound, respectively, as in FIG. 1.

Figure 3:
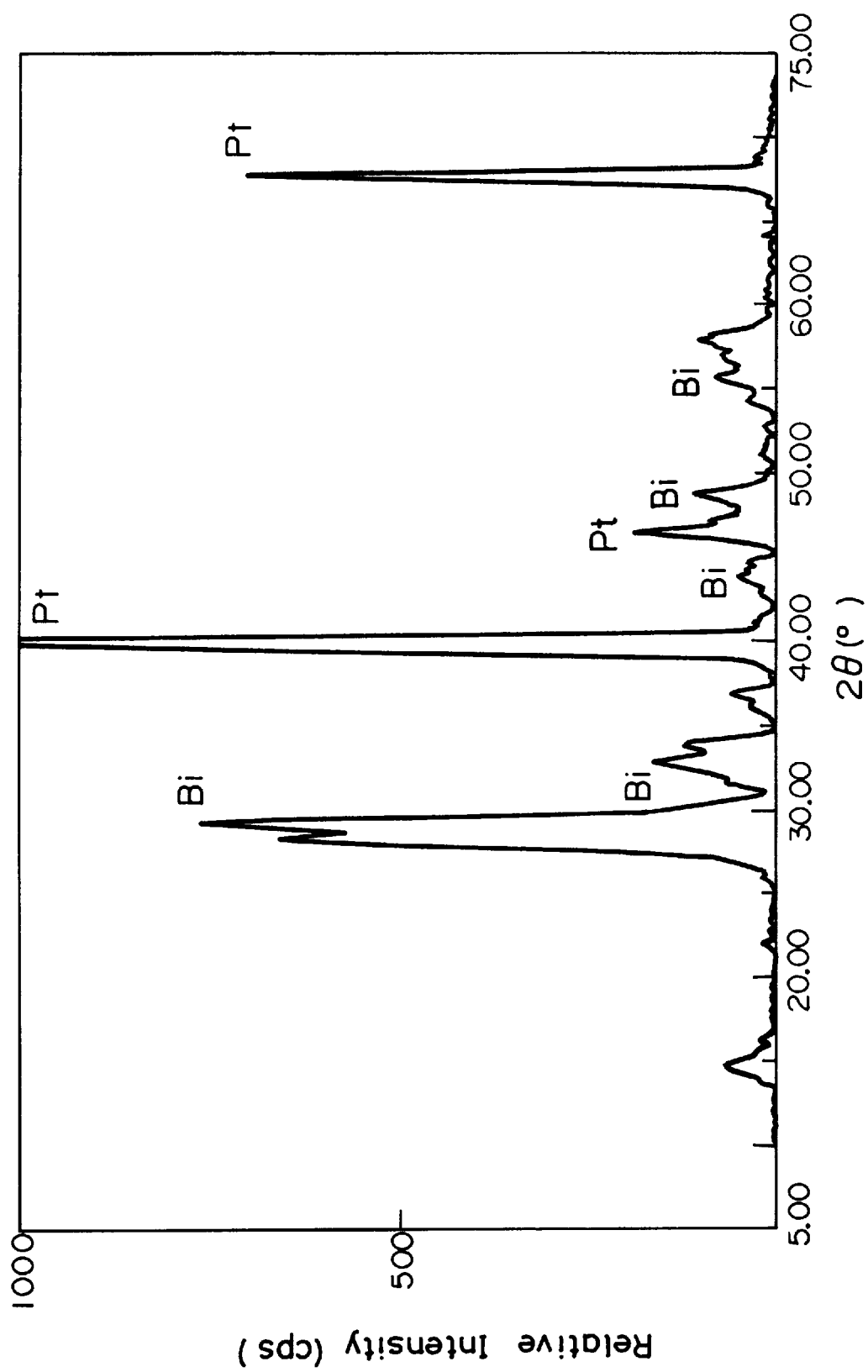
FIG. 3 is an X-ray diffraction pattern of a thin film heated in oxygen environment at 5 torr for about 30 minutes.
Figure 4:
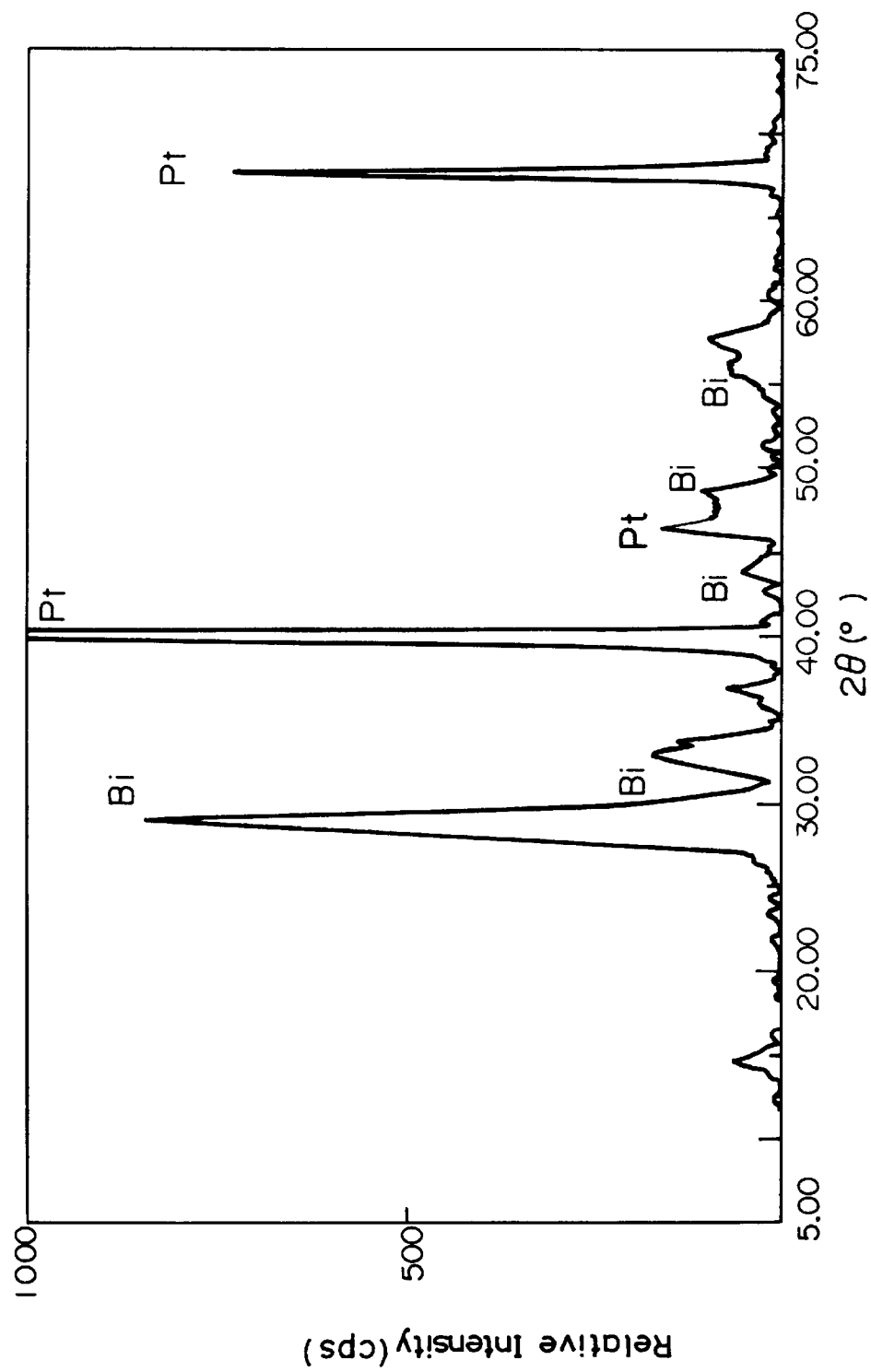
FIG. 4 is an X-ray diffraction pattern of a thin film heated in oxygen environment at 10 torr for about 30 minutes.

As seen from FIGS. 3 and 4, the phase fraction of bismuth layer compound increases as the oxygen pressure is raised.

However, even if the oxygen pressure is further raised, for example, up to about 20 torr, the phase fraction of bismuth layer compound is remained substantially unchanged (date not shown).

Furthermore, the thin film comprising a compound partially containing the bismuth layer compound is heated in oxygen gas containing a few percent of ozone at a low temperature of about 400° C. for 30 minutes.

The temperature in this step is important in view of optimization of the ozone concentration. Too high or too low temperature will not give a sufficient ozone concentration.

As a result, a thin film comprising a bismuth layer compound having a desired composition $Bi_2SrTa_2O_9$ as a main phase.

Figure 5:
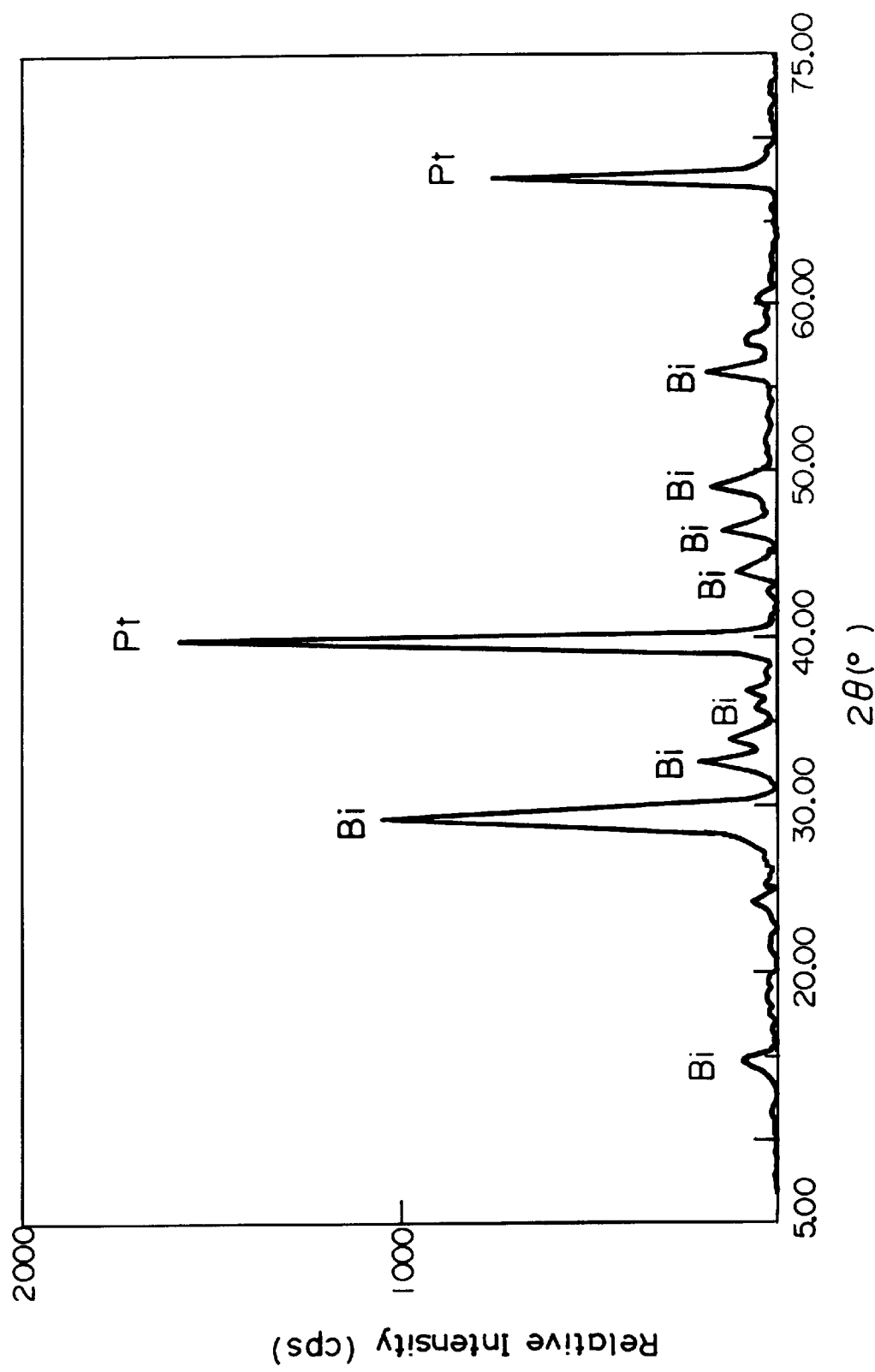
FIG. 5 is an X-ray diffraction pattern of a thin film obtained by heating the compound thin film, which was consecutively treated in oxygen environment at 5 torr and 10 torr, in oxygen containing a few percent of ozone at 400° C.

The X-ray diffraction pattern of the thin film after the ozone treatment is shown in FIG. 5. It can be seen although it contains a small amount of bi-products, a main phase comprises a desired bismuth layer compound.

In FIG. 5, Pt and Bi represent peaks derived from platinum and bismuth layer compound, respectively, as in FIG. 1.

Thus, by heating a precursor material under reduced pressure, a reduced phase could be obtained at a lower temperature than conventional ones; this reduced phase could be heated in an oxidizing environment to yield a desired bismuth layer compound.

In the above mentioned example, the desired bismuth compound was a bismuth layer compound represented by the composition $Bi_2SrTa_2O_9$: for any bismuth compounds of other composition, however, a thin film with any desired composition can be obtained in a similar manner.

The process for preparing a bismuth compound according to the present invention is not limited to the above mentioned example and other various variations may be made without departing from the scope thereof.

According to the above mentioned process for preparing a bismuth compound of the present invention, a reduced phase can be produced at a lower temperature than conventional temperature by heating a precursor material in a reduced pressure environment.

Further, by heating the precursor material in oxygen environment containing a few percent of ozone at a low temperature of about 400° C., a bismuth compound which was difficult to obtain at a low temperature of 700° to 800° C. by conventional methods can be obtained at a treatment temperature of 650° C. or lower.

Thus, since the heat treatment temperature can be decreased, generation of any hillock (i.e., growth of coarse particles) in a platinum lower electrode or deterioration of a buffer layer which is formed between the platinum lower electrode and an electrode-forming surface may be prevented in the construction of ferroelectric capacitors using a bismuth compound.

Accordingly, in elements using a bismuth compound, deterioration of layers diffusion of a part of constitutional elements due to heat treatment at a high temperature may be prevented resulting in the construction of elements of better performance.

Having described a preferred embodiment of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A process for preparing a bismuth compound comprising a first step of heating a precursor material of a bismuth compound under a reduced pressure environment to produce a reduced phase and a second step of heating to oxidize said precursor material in which the reduced phase has been produced under an oxidizing environment at a normal or lower pressure.

2. The process for preparing a bismuth compound according to claim 1, wherein said bismuth compound is a bismuth layer compound represented by the composition formula:

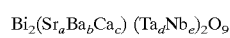

$$Bi_2(Sr_aBa_bCa_c)(Ta_dNb_e)_2O_9$$

where a, b, c, d and e are atomic ratios having values of 0 to 1 such that a+b+c=1 and d+e=1, or other bismuth layer compound having the layer structure of the above defined bismuth layer compound and including a compositional discrepancy from the above defined composition due to nonstoichemistry.

3. The process for preparing a bismuth compound according to claim 1, wherein said bismuth compound is a bismuth layer compound represented by the composition formula $Bi_2SrTa_2O_9$, or other bismuth layer compound having the layer structure of the above defined bismuth layer compound and including a compositional discrepancy from the above defined composition due to nonstoichemistry.

4. The process for preparing a bismuth compound according to claim 1, wherein said precursor material has a fluorite structure.

5. The process for preparing a bismuth compound according to claim 4, wherein an oxygen-containing starting material is used as a Bi source for said precursor material having a fluorite structure.

6. The process for preparing a bismuth compound according to claim 4, wherein a film is formed from said precursor material having a fluorite structure under an oxidizing gas environment with an oxygen partial pressure of 20 to 70% at a temperature of 400° to 750° C.

7. The process for preparing a bismuth compound according to claim 1, wherein said reduced pressure environment is $1 \times 10^{-2}$ torr or lower.

8. The process for preparing a bismuth compound according to claim 1, wherein after said first step, the environmental pressure is gradually increased before heating in said second step.

9. The process for preparing a bismuth compound according to claim 1, wherein said second step includes a heating treatment under an ozone-containing environment.

10. A process for preparing a bismuth compound comprising steps of:

heating a precursor material of a bismuth compound under a reduced pressure environment to produce a reduced phase;

heating said precursor material under an oxidizing environment at a normal or lower pressure; and after the above steps, heating under an ozone-containing environment.

11. A process for preparing a bismuth compound comprising steps of:

heating a precursor material of a bismuth compound having a fluorite structure under a reduced pressure environment to produce a reduced phase;

heating said precursor material under an oxidizing environment while increasing the pressure gradually from said reduced pressure environment; and after the above steps, heating under an ozone-containing environment.

* * * * *